United States Patent [19]

Harrington, III

[11] Patent Number: 4,906,588
[45] Date of Patent: Mar. 6, 1990

[54] ENCLOSED BURIED CHANNEL TRANSISTOR

[75] Inventor: Thomas E. Harrington, III, Carrollton, Tex.

[73] Assignee: Dallas Semiconductor Corporation, Dallas, Tex.

[21] Appl. No.: 210,242

[22] Filed: Jun. 23, 1988

[51] Int. Cl.$^4$ .................. H01L 21/265; H01L 27/00
[52] U.S. Cl. ........................... 437/44; 437/41; 437/34; 437/57; 357/23.3; 357/23.12
[58] Field of Search ............... 357/23.3, 23.12; 437/40, 41, 44, 34, 57, 238

[56] References Cited

U.S. PATENT DOCUMENTS

| | | | |
|---|---|---|---|
| 3,305,708 | 2/1967 | Ditrick | 357/23.12 |
| 3,996,655 | 12/1976 | Cunningham et al. | 437/44 |
| 4,062,699 | 12/1977 | Armstrong | 437/44 |
| 4,070,687 | 1/1978 | Ho et al. | 437/44 |
| 4,078,947 | 3/1978 | Johnson et al. | 357/23.3 |
| 4,142,926 | 3/1979 | Morgan | 437/44 |
| 4,143,388 | 3/1979 | Esaki et al. | 357/23.3 |
| 4,173,818 | 11/1979 | Bassous et al. | 357/23.3 |
| 4,205,330 | 5/1980 | Klein | 357/23.12 |
| 4,209,349 | 6/1980 | Ho et al. | 437/44 |
| 4,229,756 | 10/1980 | Sato et al. | 357/23.3 |
| 4,236,167 | 11/1980 | Woods | 357/23.12 |
| 4,247,860 | 1/1981 | Tihanyi | 357/23.12 |
| 4,282,539 | 8/1981 | Schrader | 357/23.3 |
| 4,382,826 | 5/1983 | Pfleiderer et al. | 357/23.3 |
| 4,514,897 | 5/1985 | Chiu et al. | 437/44 |
| 4,677,735 | 7/1987 | Malhi | 437/200 |
| 4,697,198 | 9/1987 | Komori | 357/23.3 |
| 4,746,624 | 5/1988 | Cham | 437/44 |

FOREIGN PATENT DOCUMENTS

| | | | |
|---|---|---|---|
| 0024905 | 11/1981 | European Pat. Off. | 357/23.12 |
| 0071335 | 2/1983 | European Pat. Off. | 357/23.3 |
| 0022480 | 2/1977 | Japan | 357/23.12 |
| 0026666 | 2/1980 | Japan | 357/23.12 |
| 0151363 | 11/1980 | Japan | 357/23.12 |
| 0193065 | 11/1982 | Japan | 357/23.12 |

OTHER PUBLICATIONS

"Self-Aligned P+ Implanted Regions for Compound Semiconductor FETs", IBM Technical Disclosure Bulletin, vol. 31, No. 4, Sep. 1988, pp. 421-423.
Ogura et al., "A Half Micron MOSFET Using Double Implanted LDD", IEDM 1982, pp. 718-721.

Primary Examiner—Brian E. Hearn
Assistant Examiner—M. Wilczewski
Attorney, Agent, or Firm—Worsham, Forsythe, Sampels & Wooldridge

[57] ABSTRACT

An enclosed buried channel device includes a buried channel region (26) disposed under a gate electrode (24). Source and drain regions (54) and (56) are formed on either side of gate electrode (26). The source/drain regions (54) and (56) are separated from the various channel region (26) by isolating regions of N-type material (58) and (60), respectively. The isolating regions (58) and (60) are operable to be inverted during normal operation of the transistor when the transistor is conducting, but are operable to isolate fields on the drain side of the transistor from the buried channel region (26) to lower the leakage current of the device in the off state.

12 Claims, 2 Drawing Sheets

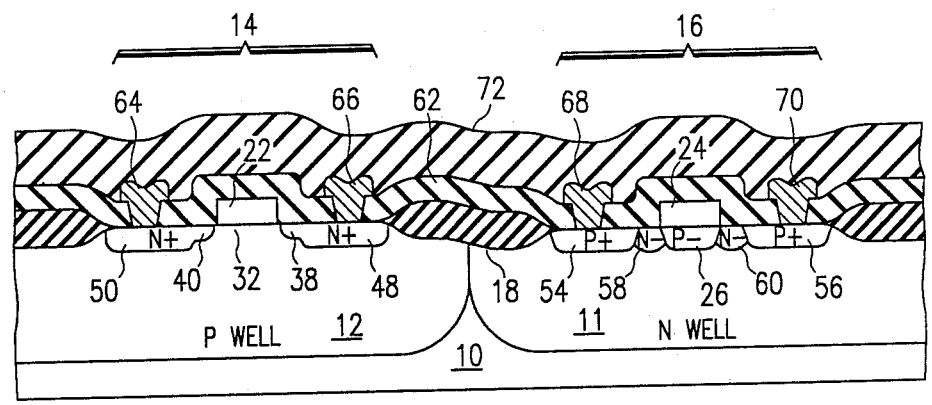
FIG. 5
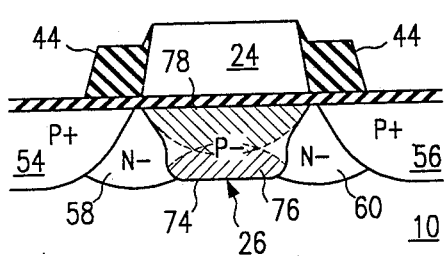
FIG. 6
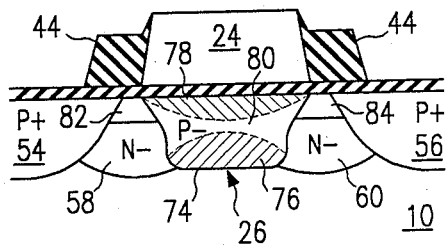
FIG. 7
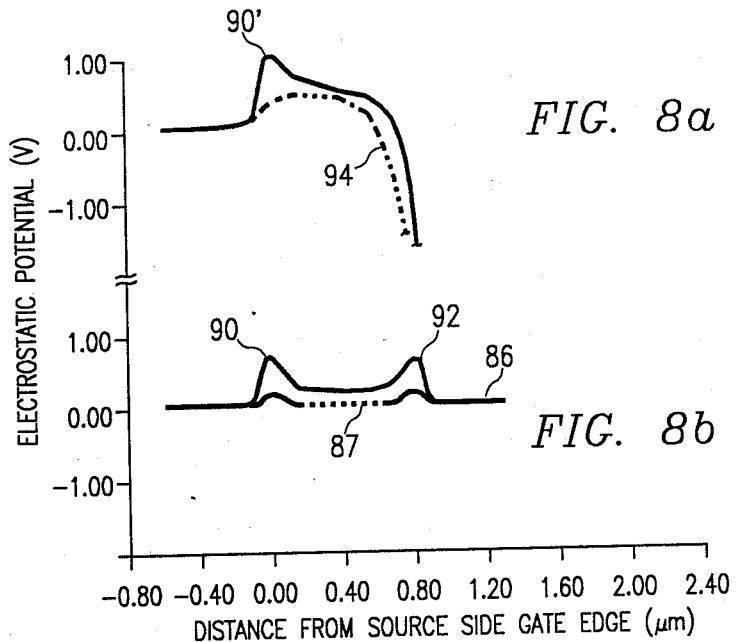
FIG. 8a
FIG. 8b

ENCLOSED BURIED CHANNEL TRANSISTOR

TECHNICAL FIELD OF THE INVENTION

The present invention pertains in general to the buried channel MOSFET and, more particularly, to buried channel MOSFETs with a short channel length.

BACKGROUND OF THE INVENTION

In the fabrication of MOS transistors, ion implantation techniques have been widely utilized in the channel region to either facilitate processing or to improve the operating parameters of the transistor. For example, channel implants have been utilized to provide threshold voltage adjustment, to reduce punch-through between the source and drain and for forming a buried-channel device by incorporating within the surface region impurities of the type opposite to that of the substrate impurities.

In the buried channel MOSFET, the conducting channel is in the bulk semiconductor rather than at the Si—SiO$_2$ interface as in a conventional MOSFET. The actual doping profile for the channel region typically has the peak centered in the channel region such that a metallurgical junction is formed beneath the surface of the substrate. Therefore, a surface depletion region is formed at the Si—SiO$_2$ interface and a junction depletion region is formed about the metallurgical junction. The width of these two depletion regions depends upon the applied voltages. The gate of the transistor modulates the width of the surface depletion region.

A buried channel MOSFET can be fabricated as a normally-on or a normally-off device, depending on the surface doping and junction depth. In a normally-off device, the junction depletion region and the surface depletion region normally touch or overlap to pinch off the buried channel region. The voltage difference between the gate, the Fermi level of the channel region and the Fermi level of the underlying substrate are such that the channel region is depleted of carriers. The gate voltage is then operable to vary the surface depletion region to allow, for example, holes in the P-channel transistor to flow from the source to the drain.

One problem that occurs in buried channel MOSFETs is when the length of the channel region is reduced. As the drain and the source are brought closer together, the surface depletion region under control of the gate is no longer able to fully pinch off the channel region when the drain has a large voltage potential disposed thereon. This is due to the fact that the large potential on the drain of a buried channel transistor overcomes the pinch off of the surface depletion region, thus resulting in leakage through the buried channel.

As channel lengths decrease further in MOSFETs, other departures from long channel behavior may occur. These departures, the short channel effects, arise as a result of a two-dimensional distribution of high electric fields in the channel region. One approach to avoid the short channel effect is to maintain the long channel behavior by simply scaling down all dimensions and voltages of a long channel MOSFET, so that the internal electric fields are the same. Traditionally, this shrinking includes oxide thickness, channel length, channel width and junction depth. In addition, doping levels are increased by a predetermined scaling factor and all voltages are reduced by the same scaling factor, leading to a reduction of the junction depletion width by that factor. As a result, the subthreshold current remains essentially the same for the long channel device and the scaled down device. However, there are limitations to the amount of scaling that can be accomplished and, as such, reduction in the channel length with respect to buried channel devices still results in limitations with respect to leakage. In order to further reduce the channel length of the buried channel transistor, other techniques in addition to scaling will be required.

SUMMARY OF THE INVENTION

The present invention disclosed and claimed herein comprises a method for forming a buried channel transistor. The method includes the steps of first providing a substrate of a first conductivity type and then forming a region of a second conductivity type impurity in the substrate at the surface thereof. A layer of oxide is then formed over the surface of the substrate followed by the formation of a gate electrode on the upper surface thereof. The gate electrode defines a buried channel region thereunder. An isolating region of first conductivity type impurities is formed on the drain side of the transistor and adjacent to the buried channel region and having a concentration greater than or equal to that of the substrate. A drain region is then formed adjacent to the isolating region and separated from the buried channel region by the isolating region. A source region of the second conductivity type impurities is then formed on the opposite side of the buried channel region and gate electrode from the drain region. In another embodiment of the present invention, the isolating region is disposed on both sides of the buried channel region to separate the source and drain regions from the buried channel region. The concentration of the buried channel region is greater than or equal to that of the substrate, but lower than the concentration of the source/drain regions.

In yet another aspect of the present invention, the buried channel transistor is fabricated by first introducing impurities of the second conductivity type into the substrate in a defined active region. A layer of gate oxide is then formed on the substrate followed by formation of the gate electrode. The first conductivity type impurities are then introduced into the substrate utilizing the edge of the gate electrode as a mask. A layer of spacer sidewall oxide is then disposed on the vertical surfaces of the gate electrode and disposed therefrom by a predetermined distance. Second conductivity type impurities are then introduced into the substrate having a concentration higher than the isolating region impurities to form the source/drain regions. The source/drain regions are therefore separated from the buried channel region by the isolating regions, with the isolating regions formed on both sides of the buried channel region.

BRIEF DESCRIPTION OF THE DRAWINGS

For a more complete understanding of the present invention and the advantages thereof, reference is now made to the following description taken in conjunction with the accompanying Drawings in which:

FIG. 5 illustrates the step of forming the metal interconnect layer;

FIG. 6 illustrates a cross-sectional diagram of the buried channel transistor and the depletion regions in the buried channel;

FIG. 7 illustrates the depletion regions of the transistor of FIG. 6 with a conductive channel formed therein; and FIGS. 8a and 8b illustrate potential diagrams of the channel region of the buried channel transistor.

Figure 1:
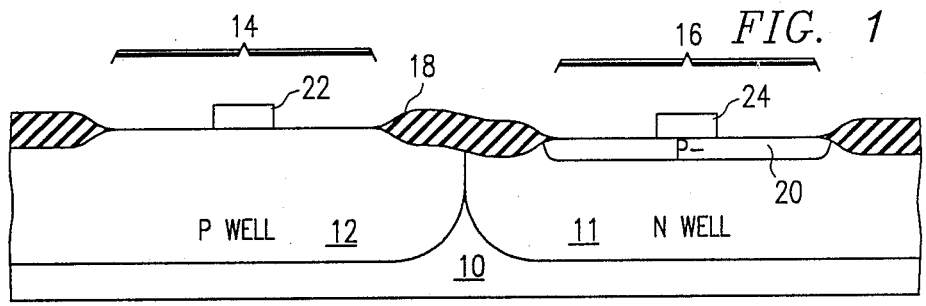
FIG. 1 illustrates a cross-sectional diagram of a twin tub CMOS process after formation of the poly gates in the transistors.

It will be appreciated that for purposes of clarity and where deemed appropriate, reference numerals have been repeated in the figures to indicate corresponding features and that the cross-sectional diagrams have not necessarily been drawn to scale in order to more clearly show important features of the present invention.

DETAILED DESCRIPTION OF THE INVENTION

Referring now to FIG. 1, there is illustrated a cross-sectional diagram of a semiconductor substrate 10 having an N-type conductivity in which a P-well 12 is formed by a conventional process. An active area 14 is formed in the P-well 12 in which N-channel transistors will be formed, and an active area 16 is formed in the N-type substrate 10 outside of the P-well 12 in which P-channel transistors will be formed. A layer of field oxidation 18 is provided on the surface of the substrate 10 for separating the two active regions 14 and 16. After forming the P-well 12, the active region 14 is masked off with photoresist and P-type impurities introduced into the active region 16 to a dosage of approximately 3E12 ion/cm$^2$, resulting in a concentration of approximately $10^{16}$ ion/cm$^3$. This forms a layer 20 of P-type impurities in the surface of an N-type substrate 10. The P-type impurities utilized are boron.

After formation of the layer 20, a layer of gate oxide is thermally grown over both the active region 14 and the active region 16. A conformal layer of polycrystalline silicon (poly) is then deposited on the substrate and etched to form an N-channel gate 22 in the active region 14 and a P-channel gate 24 in the active region 16.

Figure 2:
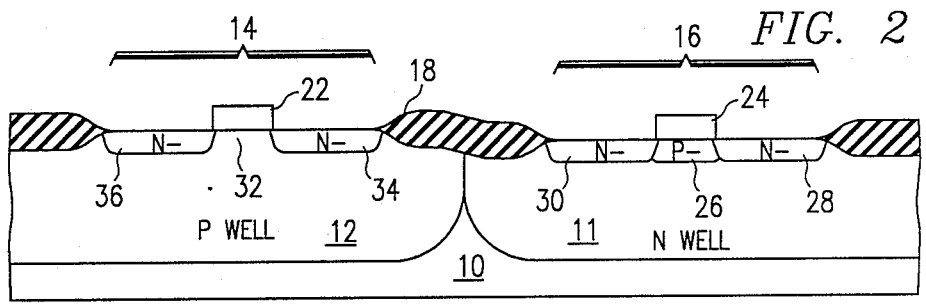
FIG. 2 illustrates the step of implanting phosphorous into the source and drain regions on either side of the gate of both the N- and P-channel transistors.

Referring now to FIG. 2, after formation of the P-type layer 20 in the active region 16, the active region 14 is exposed and N-type impurities, which, in the preferred embodiment are phosphorous, are implanted into the active regions 14 and 16 on either side of the gates 22 and 24. The gates 22 and 24 provide a self-alignment process which is well-known in the art. In the active region 16, the N-type impurities have a higher concentration that the P-type impurities, resulting in N-type regions formed on either side of the gate 24. This defines a buried channel region 26 defined under the P-channel gate 24, which channel region 26 is comprised of P-type impurities. The buried channel region 26 is bounded on either side by an n− region 28 and an n− region 30. In a similar manner, the active region 14 has a channel region 32 formed under the N-channel gate 22, the channel region 32 comprised of the P-type impurities of the P-well 12. The channel region 32 is bounded on either side by an n− region 34 and an n− region 36. The n− regions 28 and 30 and 34 and 36 have a concentration of approximately $10^{17}$ ion/cm$^3$, as a result of the implant step wherein the dosage was approximately 5E12 ions/cm$^2$. As will be described hereinbelow, the existence of the n− regions 28 and 30 in the active region 16 provide a departure from the standard processing of a buried P-channel transistor.

Figure 3:
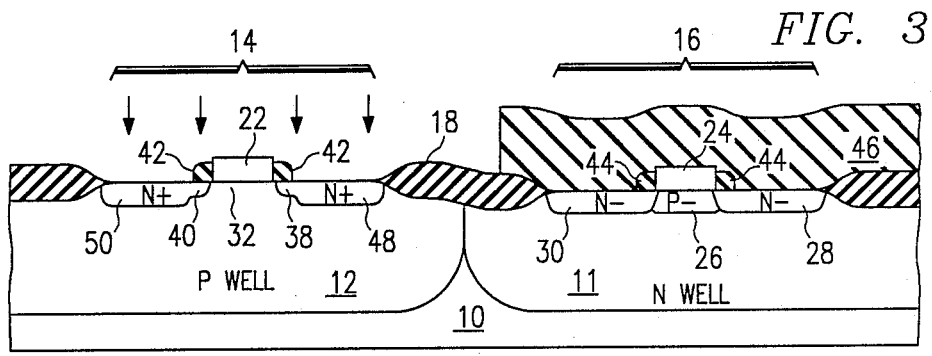
FIG. 3 illustrates the step of forming the source and drain regions for the N-channel transistor.

Referring now to FIG. 3, after formation of the n− regions 28 and 30, the active region 16 is masked off with a layer of photoresist (not shown) and the n− regions 34 and 36 in the active region 14 exposed. An additional phosphorous ion implantation is made into the active region 14 to increase the concentration of N-type impurities for the purposes of fabricating a lightly doped drain (LDD) transistor. The dosage for an LDD transistor is higher than the desired concentration of the n− regions 28 and 30 and, as such, it is necessary to provide this additional step. This results in the n− regions 34 and 36 bounding either side of the channel region 32.

After performing the LDD implant into the regions 34 and 36, the photoresist is removed and sidewall oxide spacers 42 are formed on the vertical surfaces of N-channel gate 22 and sidewall oxide spacers 44 are formed on the vertical surfaces of P-channel gate 24. Although not illustrated in detail, fabrication of the sidewall oxide spacers 42 and 44 is achieved by first depositing a conformal layer of oxide over the substrate to a predetermined thickness. This oxide layer is then anisotropically etched in the vertical direction to remove the oxide from all surfaces which are essentially horizontal. This leaves the oxide on the essentially vertical surfaces. The fabrication of sidewall oxide spacers is well-known in the art.

After formation of the sidewall oxide spacers 42 and 44, a layer of photoresist is deposited on the substrate and patterned to form a photoresist layer 46 covering the active region 16. Arsenic is then implanted into the substrate to form the source and drain regions of the N-channel transistor. The spacers 42 on the N-channel gate 22 provide the function of spacing the source/drain implants away from the channel region 32. This results in source/drain regions 48 and 50 with a reach-through LDD implant 38 extending from the source/drain region 48 to the channel region 32, and a reach-through LDD implant 40 extending from the source/drain region 50 to the channel region 32.

Figure 4:
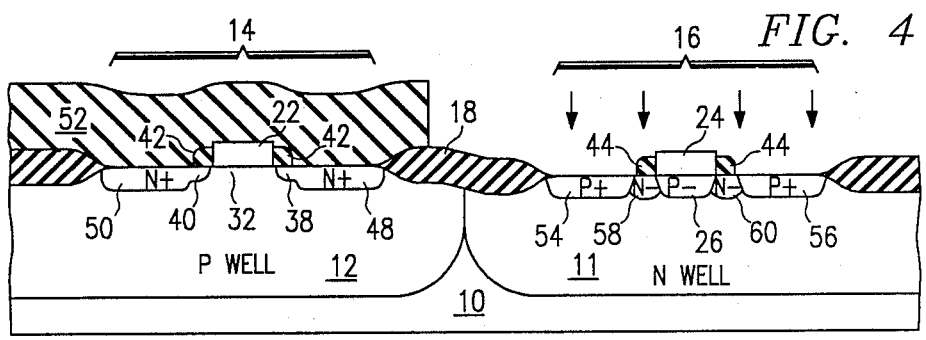
FIG. 4 illustrates the step of forming the source and drain regions for the P-channel transistor.

Referring now to FIG. 4, after implanting of the source/drain regions 48 and 50 for the N-channel transistor, the photoresist layer 46 is stripped off and the active region 14 is then covered by a layer of photoresist 52. This causes the active region 16 being exposed. A boron implant of a dosage suitable for a source/drain region is then performed, resulting in p+ regions 54 and 56 being formed on either side of the P-channel gate 24 and separated from the edges thereof by the spacers 44. This results in an n− isolation region 58 being formed between the p+ region 54 and the buried channel region 26 and an n− isolation region 60 being formed between the p+ region 56 and the buried channel region 26. As will be described hereinbelow, the isolation regions 58 and 60 act to enclose the buried channel region 26 and provide a potential barrier thereto.

Referring now to FIG. 5, after formation of the isolation regions 58 and 60, the photoresist layer 52 is removed and then oxide deposited at low temperature to provide the poly/metal interlevel oxide layer, designated by a reference numeral 62. The substrate is then subjected to a thermal cycle for oxide reflow and the source/drain activation/drive step. Vias are then formed in the layer 62 and contacts 64, 66, 68 and 70 formed therethrough to contact the source/drain regions 50 and 48 and the source/drain regions 54 and 56 respectively. Although not shown, vias are also formed through the interlevel oxide layer 62 to expose a portion of the poly gates 22 and 24 for interconnection thereto. Thereafter, a passivation layer 72 is formed over the substrate.

Referring now to FIG. 6, there is illustrated a detail of the buried channel region 26 and the source/drain regions 54 and 56 on either side thereof. It can be seen that the buried channel region 26 is totally enclosed on either side thereof by the n− isolation regions 58 and 60 such that there is a PN junction formed between the p+ regions 54 and 56 and the buried channel region 26 of the P-channel transistor. The device of the illustrated embodiment is a normally-off device such that no current conducts when the gate voltage is below the threshold voltage $V_T$.

The buried channel region 26 has a metallurgical junction 74 formed between the buried channel region 26 and the N-type substrate 10. There is a junction depletion region 76 associated with the metallurgical junction 74 and a surface depletion region 78 associated with the Si-SiO$_2$ interface. With subthreshold voltages applied to the gate, the surface depletion region 78 overlaps the junction depletion region 76, thus inhibiting current flow through the buried channel region 26. This is the way in which a conventional buried channel transistor is turned off. In order to turn on a conventional buried channel transistor, the gate voltage is increased to a level greater than the threshold voltage, such that the surface depletion region 78 is pulled away from the junction depletion region 76 and holes allowed to conduct through the buried channel region 26, thus forming a buried channel.

When the transistor is turned off, the only current being conducted through channel region 26 is leakage current. It is desirable to maintain this leakage current as low as possible for all drain voltages when the gate voltage is disposed at subthreshold voltages. One problem that exists with short channel transistors is that the fields from the drain of the transistors extend into the buried channel region 26 and disrupt the integrity of the depletion regions 76 and 78 and allow holes to flow through the buried channel region 26. This in effect allows the drain to reach through the buried channel region to the source of the transistor.

The fields generated as a result of a large potential on the drain of the transistor are due to the width of the depletion region that surrounds the drain of the transistor. For large negative voltages on the drain of a P-channel transistor with a gate of zero, this depletion region extends vertically into the substrate 10 and horizontally outward from the drain of the transistor and into the channel of the transistor. By varying doping levels and junction depths, the extent of this reach-through can be minimized. By utilizing the isolation regions 58 and 60, the width of the depletion region in the horizontal direction extending from the drain of the transistor to the buried channel region is decreased. This reduces the effect that the depletion region on the drain of the transistor has on the buried channel region 26 as a result of a large negative voltage on the drain of the transistor.

In the ideal case, it would be desirable to have a very heavily doped N-type region as the isolating region when the transistor is turned off. However, this would be impractical in that a heavily doped N-type region would be incapable of being inverted without applying a large gate voltage, that is, the device threshold would be increased to an unacceptable value. Therefore, the doping level of the isolating regions 58 and 60 is chosen to provide the maximum isolation while still being invertible by a reasonable threshold voltage.

Referring now to FIG. 7, there is illustrated the normal operation, wherein the surface depletion region 78 is pulled away from the junction depletion region 76 when the gate voltage is above the threshold voltage $V_T$. This results in a channel 80 being formed through the buried channel region 26 and disposed between the junction depletion region 76 and the surface depletion region 78. In addition, the surface of the n− region 58 and the n− region 60 are inverted to form surface inversion regions 82 and 84, respectively The formation of these inverted regions 82 and 84 results in the $V_T$ of the transistor being raised slightly higher than would be expected. However, any problems caused by the additional $V_T$ of the transistor are minimized compared to advantages provided by the isolation realized between the p+ regions 54 and 56 and the buried channel region 26.

During normal operation, it is only necessary that there be a conducting channel between the source and drain region and the buried channel region 80, as is realized with the inverted regions 82 and 84. If a very narrow conductive region could be realized between the source and drain regions and the buried channel region 26, a much higher concentration of N-type impurities could be utilized for the isolation regions 58 and 60. This higher level of impurities would further reduce the effect of the transverse electric fields extending from the drain of the transistor into the channel region 26. To this extent, the upper portion of the source and drain regions could overlap with the upper portion of the buried channel region 26, as long as at least a portion of the drain was isolated from the buried channel region 26 by isolation regions 58 and 60.

Referring now to FIGS. 8a and 8b, there are illustrated plots of the electrostatic potential along the channel from the source to the drain of the transistor of FIG. 7, wherein potential is plotted as a function of distance from the source side to the gate edge in microns. Curves 86 and 87 represent the operation of the buried channel device of the present invention with a gate voltage of −5.0 volt and a drain voltage of −0.05 volts. Curve 86 illustrates the potential at a depth of 0.056 microns and curve 87 represents the potential at the surface. This represents the on condition with strong channel inversion. A curve 88 illustrates the condition where the gate voltage is 0.0 volts and the drain voltage is −5.0 volts, representing a possible punch through condition. It can be seen that curve 86 has a potential across the channel that is not flat. There are two potential "hills" 90 and 92, potential hill 90 occurring on the source side of the transistor and potential hill 92 occurring on the drain side of the transistor. These are due to the doping in regions 58 and 60, making it more difficult for holes to pass directly from source and drain into the middle of the buried channel. Holes must instead pass into the channel region by traveling along the surface inversion regions 82 and 84, where the potential hills are much smaller, as illustrated in curve 87.

When the drain voltage is much lower than the gate voltage, thus providing a large potential on the drain side of the transistor, the potential hill provided by the isolating regions 58 and 60 on the drain side provide a potential barrier to the middle of the channel in order to conduct through the channel. This is to be compared with the operation of the transistor without the isolating regions 58 and 60, as illustrated by the curve 94 in phantom. It can be seen that the curve 94 has a lower electrostatic potential across the channel, and therefore, some increased leakage current will occur.

In summary, there has been provided an enclosed buried channel device wherein n− regions are disposed between the p− buried channel region and the p+ source/drain regions. The n− regions provide an isolation when the transistor is turned off and a large drain potential is present. The isolation regions prevent disruption of the surface depletion region within the buried channel region, thus preventing leakage current flowing therethrough.

Although the preferred embodiment has been described in detail, it should be understood that various changes, substitutions and alterations can be made therein without departing from the spirit and scope of the invention as defined by the appended claims.

What is claimed is:

1. A method for forming a buried channel transistor, comprising:
    providing a semiconductor substrate of a first conductivity type;
    introducing dopants, to form a buried channel region of a second conductivity type opposite to said first conductivity type in the surface of the semiconductor substrate;
    forming a layer of oxide over the buried channel region;
    forming a gate electrode on the surface of the layer of oxide and covering the buried channel region;
    forming an isolating region of the first conductivity type in the surface of the substrate adjacent to one side of the buried channel region;
    introducing dopants, to form a drain region of the second conductivity type adjacent to the isolating region and at least a portion thereof separated from the buried channel region by the isolating region; and
    introducing dopants, to form a source region of the second conductivity type on the opposite side of the buried channel region from the drain region and proximate to the buried channel region;
    wherein said steps of forming the isolating region and the drain region comprise:
        introducing impurities of the first conductivity type into the surface of substrate utilizing the vertical edge of the gate electrode as an alignment mask;
        forming a spacer insulating material to a predetermined thickness extending from the vertical edge of the gate electrode on the drain side of the transistor; and
        introducing impurities of the second conductivity type into the surface of the substrate on the surface of the transistor utilizing the outermost edge of the spacer as an alignment mask such that impurities are inhibited from being introduced into the substrate underneath the spacer, the step of introducing impurities of the second conductivity type into the substrate to form the drain utilizing a higher dose of impurities than the level of impurities utilized to form the isolating region.

2. The method of claim 1 wherein the substrate comprises silicon.

3. The method of claim 1 wherein the concentration of the isolating region is higher than the concentration of the substrate and is capable of being inverted at the surface.

4. The method of claim 1 wherein the isolating region is disposed on both sides of the buried channel region and separates at least a portion of the source region from the buried channel region.

5. The method of claim 4 wherein the isolating regions on either side of the buried channel region completely separate the source and drain regions from the buried channel region.

6. The method of claim 1 wherein the isolating region completely separates and isolates the drain region from the buried channel region.

7. A method for forming a buried channel transistor, comprising:
    providing a substrate of a first conductivity type;
    defining an active region on the surface of the substrate and bounded by a layer of isolating oxide;
    introducing impurities of a second conductivity type opposite to the first conductivity type into the surface of the substrate in the active region to define a first region;
    forming a layer of gate oxide over the active region to a predetermined thickness;
    forming a gate electrode over the active region and having a predetermined dimension to define a buried channel region in the active region under the gate electrode;
    introducing impurities of the first conductivity type into the active region utilizing the gate electrode as a mask to form second and third regions on opposite sides of the gate electrode, the concentration of the impurities of the first conductivity type being greater than the concentration of the impurities of the second conductivity type in the first region;
    forming spacers of insulating material on the vertical edges of the gate electrode and extending therefrom in the horizontal direction by a predetermined distance; and
    introducing impurities of the second conductivity type into the second and third regions utilizing the edge of the spacers as a mask to form source/drain regions, the level of the second conductivity type impurities in the source/drain regions greater than the first conductivity type impurities in the second and third regions;
    wherein an isolating region of first conductivity type material separates at least a portion of the source/drain regions from the buried channel region.

8. The method of claim 7 wherein the substrate comprises silicon, the first conductivity type impurities comprise N-type impurities and the second conductivity type impurities comprise P-type impurities.

9. The method of claim 7 wherein the gate electrode is formed of polycrystalline silicon.

10. The method of claim 7 wherein the step of forming the spacers comprises forming a conformal layer of oxide over the surface of the substrate and the gate electrode and anisotropically etching the conformal layer of oxide to remove all oxide except oxide on the essentially vertical surfaces.

11. The method of claim 7 wherein the isolating regions defined under the spacers completely separate the source and drain regions from the buried channel region.

12. The method of claim 7 wherein the concentration of first conductivity type impurities in the isolating regions allow surface inversion thereof at a realizable gate voltage.

* * * * *